(12) United States Patent
Guo et al.

(10) Patent No.: US 11,721,525 B2
(45) Date of Patent: Aug. 8, 2023

(54) SENSORLESS RF IMPEDANCE MATCHING NETWORK

(71) Applicant: Applied Materials, Inc., Santa Clara, CA (US)

(72) Inventors: Yue Guo, Redwood City, CA (US); Kartik Ramaswamy, San Jose, CA (US); Yang Yang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 157 days.

(21) Appl. No.: 17/521,185

(22) Filed: Nov. 8, 2021

(65) Prior Publication Data
US 2023/0145567 A1 May 11, 2023

(51) Int. Cl.
*H01J 37/32* (2006.01)

(52) U.S. Cl.
CPC .. *H01J 37/32183* (2013.01); *H01J 37/32146* (2013.01); *H01J 37/32449* (2013.01); *H01J 37/32935* (2013.01)

(58) Field of Classification Search
CPC ........... H01J 37/32183; H01J 37/32146; H01J 37/32449; H01J 37/32935
See application file for complete search history.

(56) References Cited

U.S. PATENT DOCUMENTS

| | | | |
|---|---|---|---|
| 6,843,858 B2 | 1/2005 | Rossman | |
| 6,846,747 B2 | 1/2005 | Westerman et al. | |
| 2005/0064714 A1 | 3/2005 | Mui et al. | |
| 2011/0009999 A1 | 1/2011 | Zhang et al. | |
| 2013/0119017 A1 | 5/2013 | Yang et al. | |
| 2014/0203821 A1 | 7/2014 | Yamamoto et al. | |
| 2015/0371876 A1* | 12/2015 | Terauchi | H01L 21/32136 156/345.28 |
| 2018/0247795 A1 | 8/2018 | Maier et al. | |
| 2020/0350887 A1 | 11/2020 | Brounley et al. | |

OTHER PUBLICATIONS

PCT International Search Report and Written Opinion for PCT/US2022/047973 dated Feb. 27, 2023.

* cited by examiner

*Primary Examiner* — Henry Luong
(74) *Attorney, Agent, or Firm* — Moser Taboada

(57) ABSTRACT

Methods and apparatus for plasma processing substrate are provided herein. The method comprises supplying from an RF power source RF power, measuring at the RF power source a reflected power at the first power level, comparing the measured reflected power to a first threshold, transmitting a result of the comparison to a controller, setting at least one variable capacitor to a first position based on the comparison of the measured reflected power at the first power level to the first threshold, supplying from the RF power source the RF power at a second power level for plasma processing the substrate, measuring at the RF power source the reflected power at the second power level, comparing the measured reflected power at the second power level to a second threshold different from the first threshold, transmitting a result of the comparison, setting at the matching network the at least one variable capacitor to a second position.

20 Claims, 3 Drawing Sheets

SENSORLESS RF IMPEDANCE MATCHING NETWORK

FIELD

Embodiments of the present disclosure generally relate to a methods and apparatus for processing a substrate, and for example, to methods and apparatus that use a sensorless radio frequency (RF) impedance matching network.

BACKGROUND

Impedance matching networks used during plasma substrate (wafer) processing are known. For example, conventional RF impedance matching networks comprise electrical circuitry that is positioned between an RF source and a plasma reactor (chamber) to optimize power efficiency. For example, at a tuned matching point, maximum RF power is delivered (forward power) into the plasma load and near zero power is reflected back (reflected power) to the RF source. Conventional impedance matching networks require one or more sensors for measuring and monitoring impedances. Impedance measurements are, typically, made using a voltage and current probe and/or a magnitude and phase detector at an input and output of the impedance matching networks. In some instances, a sensor may be used at the RF matching network input port. Collected impedance magnitude and phase information are used to control one or more motorized variable capacitors of the impedance matching networks. While conventional impedance matching networks are suitable for delivering maximum power transfer into the plasma, such networks, however, use complex and relatively expensive hardware and require sensor calibration prior to use.

SUMMARY

Methods and apparatus for plasma processing a substrate are provided herein. In some embodiments, for example, a method for plasma processing a substrate comprises supplying from an RF power source RF power at a first power level suitable for igniting and maintaining a plasma within a processing volume of a plasma processing chamber, measuring at the RF power source a reflected power at the first power level, comparing the measured reflected power to a first threshold, transmitting a result of the comparison to the first threshold to a controller of a matching network, setting at the matching network at least one variable capacitor to a first position based on the comparison of the measured reflected power at the first power level to the first threshold, supplying from the RF power source the RF power at a second power level different from the first power level, the second power level for plasma processing the substrate disposed within the plasma processing chamber, measuring at the RF power source the reflected power at the second power level, comparing the measured reflected power at the second power level to a second threshold different from the first threshold, transmitting a result of the comparison of the second threshold to the controller of the matching network, setting at the matching network the at least one variable capacitor to a second position based on the comparison of the measured reflected power at the second power level to the second threshold, and continuing supplying the RF power at the second power level for plasma processing the substrate.

In accordance with at least some embodiments, a non-transitory computer readable storage medium has stored thereon instructions that when executed by a processor perform a method for plasma processing a substrate. The method comprises supplying from an RF power source RF power at a first power level suitable for igniting and maintaining a plasma within a processing volume of a plasma processing chamber, measuring at the RF power source a reflected power at the first power level, comparing the measured reflected power to a first threshold, transmitting a result of the comparison to the first threshold to a controller of a matching network, setting at the matching network at least one variable capacitor to a first position based on the comparison of the measured reflected power at the first power level to the first threshold, supplying from the RF power source the RF power at a second power level different from the first power level, the second power level for plasma processing the substrate disposed within the plasma processing chamber, measuring at the RF power source the reflected power at the second power level, comparing the measured reflected power at the second power level to a second threshold different from the first threshold, transmitting a result of the comparison of the second threshold to the controller of the matching network, setting at the matching network the at least one variable capacitor to a second position based on the comparison of the measured reflected power at the second power level to the second threshold, and continuing supplying the RF power at the second power level for plasma processing the substrate.

In accordance with at least some embodiments, a system for processing a substrate comprises an RF power source configured to supply RF power, a gas source configured to supply a process gas into a processing volume of a plasma processing chamber, a matching network configured to set at least one variable capacitor based on a result of a comparison received from the RF power source, and a controller configured to supply from the RF power source RF power at a first power level suitable for igniting and maintaining a plasma within the processing volume of the plasma processing chamber, measure at the RF power source a reflected power at the first power level, compare the measured reflected power to a first threshold, transmit the result of the comparison to the first threshold to a match controller of the matching network, set at the matching network at least one variable capacitor to a first position based on the comparison of the measured reflected power at the first power level to the first threshold, supply from the RF power source the RF power at a second power level different from the first power level, the second power level for plasma processing the substrate disposed within the plasma processing chamber, measure at the RF power source the reflected power at the second power level, compare the measured reflected power at the second power level to a second threshold different from the first threshold, transmit a result of the comparison of the second threshold to the match controller of the matching network, set at the matching network the at least one variable capacitor to a second position based on the comparison of the measured reflected power at the second power level to the second threshold, and continue supplying the RF power at the second power level for plasma processing the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
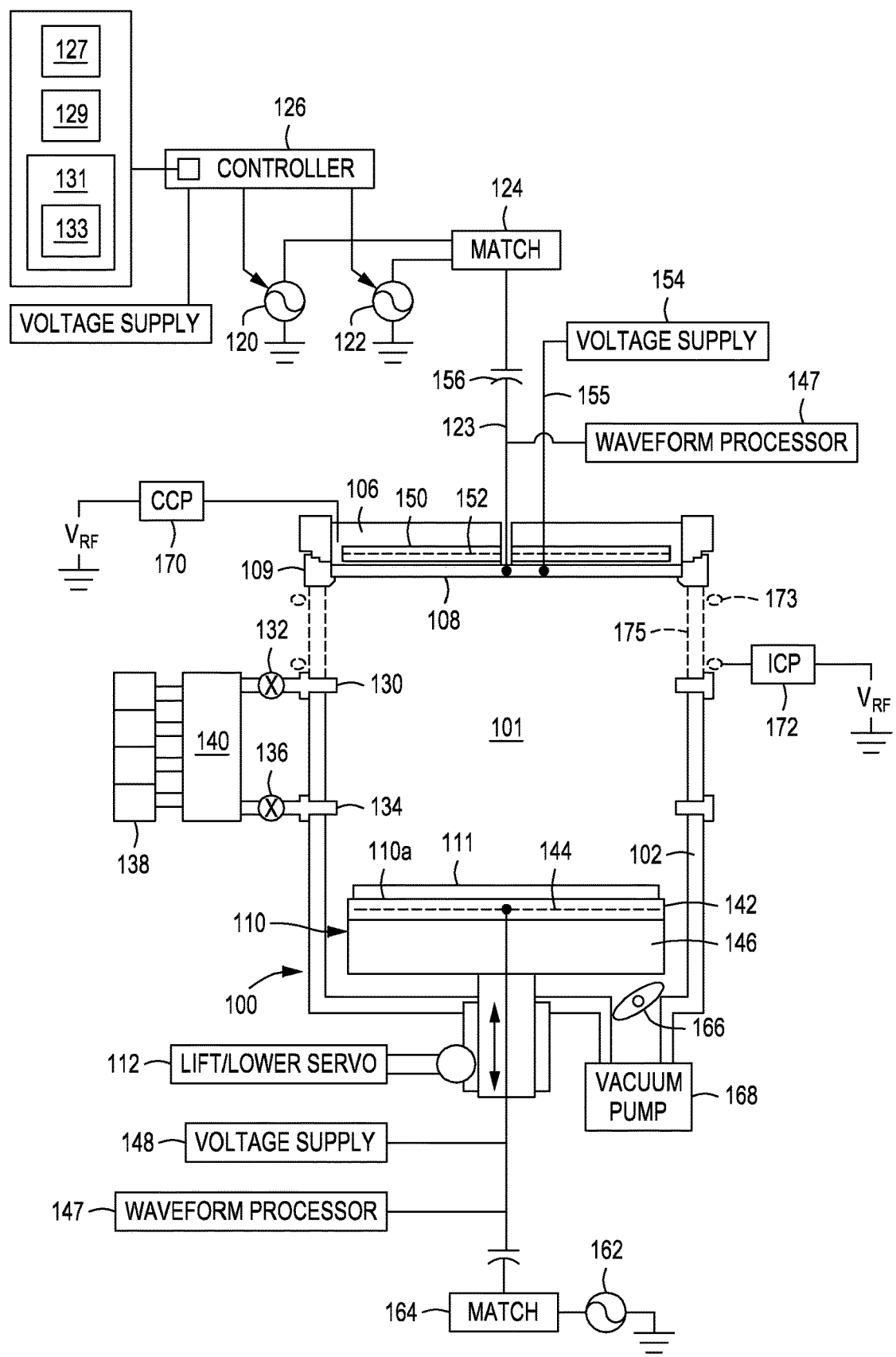
FIG. 1 is a schematic diagram of an apparatus, in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, in at least some embodiments, apparatus comprises a sensorless RF impedance matching network system for use with plasma process chambers, and methods for matching plasma load impedances of plasma process chambers. The sensorless RF matching networks and automatic matching algorithm described herein use simple, cost-effective hardware that does not require sensor calibration.

FIG. 1 is a schematic diagram of an apparatus, in accordance with at least some embodiments of the present disclosure. The apparatus is suitable for etching one or more substrates (wafers) using an electron beam (ebeam). Accordingly, in at least some embodiments, the apparatus is a processing chamber 100 (e.g., a plasma processing chamber, such as an ebeam process chamber) that is configured to perform ebeam induced etching (EBIE). The processing chamber 100 has a chamber body 102 which defines a process volume 101. In an embodiment, the chamber body 102 has a substantially cylindrical shape and may be fabricated from a material suitable for maintaining a vacuum pressure environment therein, such as metallic materials, for example aluminum or stainless steel.

A ceiling 106 is coupled to the chamber body 102 and forms the process volume 101. The ceiling 106 is formed from an electrically conductive material, such as the materials utilized to fabricate the chamber body 102. The ceiling 106 is coupled to and supports an electrode 108 (e.g., an upper electrode). In some embodiments, the electrode 108 is coupled to the ceiling 106 such that the electrode 108 is disposed adjacent or within the process volume 101. The electrode 108 is formed from a process-compatible material having a high secondary electron emission coefficient, e.g., a secondary electron emission coefficient, of about 5 to about 10. Materials having relatively high secondary emission coefficients can include, but are not limited to, silicon, carbon, silicon carbon materials, or silicon-oxide materials. Alternatively, the electrode 108 can be formed from a metal oxide material such as aluminum oxide ($Al_2O_3$), yttrium oxide ($Y_2O_3$), or zirconium oxide ($ZrO_2$). A dielectric ring 109, which is formed from an electrically insulating material, is coupled to the chamber body 102 and surrounds the electrode 108. As illustrated, the dielectric ring 109 is disposed between the chamber body 102 and the ceiling 106 and supports the electrode 108.

The ceiling 106 can include an insulating layer 150 containing a chucking electrode 152 facing the electrode 108. In at least some embodiments, a DC voltage power supply 154 can be coupled to the chucking electrode 152 via the feed conductor 155, for electrostatically clamping the electrode 108 to the ceiling 106, and to the electrode 108 for applying a DC power (e.g., a voltage potential) thereto. In such embodiments, a DC blocking capacitor 156 can be connected in series with the output of an impedance matching network 124. A controller 126 functions to control the DC voltage power supply 154.

Mechanical contact between the electrode 108 and the ceiling 106 is sufficient to maintain high thermal conductance between the electrode 108 and the ceiling 106. Additionally, a force of the mechanical contact can be regulated by the electrostatic clamping force provided by the DC voltage power supply 154.

In one or more embodiments, the ceiling 106 is electrically conductive and in electrical contact with the electrode 108. Power from the impedance matching network 124 is conducted through the ceiling 106 to the electrode 108. In one or more embodiments, the chamber body 102 can be maintained at ground potential.

In one or more embodiments, grounded internal surfaces (i.e., chamber body 102) inside the processing chamber 100 can be coated with a process compatible material such as silicon (Si), carbon (C), silicon carbon (SiC) materials, or silicon-oxide (SiO) materials, aluminum oxide ($Al_2O_3$), yttrium oxide ($Y_2O_3$), or zirconium oxide ($ZrO_2$).

In some embodiments, internal passages (not shown) for conducting a thermally conductive liquid or media inside the ceiling 106 are connected to a thermal media circulation supply. The thermal media circulation supply acts as a heat sink or a heat source.

A pedestal 110 is disposed in the process volume 101. The pedestal 110 supports a substrate 111 (e.g., semiconductor wafers, such as silicon wafers, or glass panels or other substrates, such as for solar cell, display, or other applications) thereon and has a substrate support surface 110a oriented parallel to the electrode 108. In an embodiment, the pedestal 110 is movable in the axial direction by a lift servo 112. During operation, an upper electrode, such as the electrode 108, is maintained at one or more distances (e.g., a process position) from the substrate support surface 110a. For example, in at least some embodiments, the electrode 108 is maintained from a process position for processing a substrate at a distance from about 1 inch to about 20 inches. For example, in at least some embodiments, the distance can be about 6 inches to about 10 inches.

The controller 126 is provided and coupled to various components of the processing chamber 100 to control the operation of the processing chamber 100 for processing a substrate. The controller 126 includes a central processing unit 127, support circuits 129 and a memory 131, which can be a non-transitory computer readable storage medium having instructions thereon to perform the methods described herein. The controller 126 is operably coupled to and controls one or more energy sources directly, or via computers (or controllers) associated with the processing chamber 100 and/or support system components. The controller 126 may be any form of general-purpose computer processor that can be used in an industrial setting for controlling various chambers and sub-processors. The memory 131, or non-transitory computer readable storage medium, of the controller 126 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 129 are coupled to the central processing unit 127 for supporting the central processing unit 127 in a conventional manner. The support circuits 129 include cache, power supplies, clock circuits, input/output circuitry and subsystems, and the like. Inventive methods as described herein, such as the method for processing a substrate (e.g., EBIE of a substrate), may be stored in the memory 131 as software routine 133 that may be executed or invoked to control the operation of the one or more energy sources in the manner described herein. The software routine 133 may also be stored and/or executed by a second central processing unit (not shown) that is remotely located from the hardware being controlled by the central processing unit 127.

In one or more embodiments, the pedestal 110 can include an insulating puck 142 which forms the substrate support surface 110a, a lower electrode 144 disposed inside the insulating puck 142, and a chucking voltage supply 148 connected to the electrode 144. Additionally, in at least some embodiments, a base layer 146 underlying the insulating puck 142 can include one or more internal passages (not shown) for circulating a thermal transfer medium (e.g., a liquid) from a circulation supply. In such embodiments, the circulation supply can function as a heat sink or as a heat source.

One or more RF power generators can be coupled to the processing chamber 100. In at least some embodiments, a high frequency RF power source 120 having a frequency from about 20 MHz to about 200 MHz and a low frequency RF power source 122 having a frequency from about 100 kHz to about 20 MHz are coupled to the electrode 108 through, for example, the impedance matching network 124 via an RF feed conductor 123 (RF transmission line). In at least some embodiments, the one or more RF generators can comprise a single RF source having a frequency from about 100 kHz to about 200 MHz. The RF feed conductor 123 from the impedance matching network 124 can be connected to the electrode support or ceiling 106 rather than being directly connected to the electrode 108. In such embodiments, RF power from the RF feed conductor 123 can be capacitively coupled from the electrode support to the electrode 108. The impedance matching network 124 is adapted to provide an impedance match at different frequencies of the high frequency RF power source 120 and the low frequency RF power source 122, as well as filtering to isolate the high frequency RF power source 120 and the low frequency RF power source 122 from one another. Output power levels of the high frequency RF power source 120 and the low frequency RF power source 122 can be independently controlled by the controller 126.

With the high frequency RF power source 120 and the low frequency RF power source 122, radial plasma uniformity in the process volume 101 can be controlled by selecting a distance (e.g., from about 6 inches to about 10 inches) between the electrode 108 and pedestal 110. For example, in some embodiments, a lower VHF frequency produces an edge-high radial distribution of plasma ion density in the process volume 101 and an upper VHF frequency produces a center-high radial distribution of plasma ion density. With such a selection, the power levels of the high frequency RF power source 120 and the low frequency RF power source 122 are capable of generating a plasma with a substantially uniform radial plasma ion density.

Upper gas injectors 130 provide process gas into the process volume 101 through a first valve 132, and lower gas injectors 134 provide process gas into the process volume 101 through a second valve 136. The upper gas injectors 130 and the lower gas injectors 134 can be disposed in sidewalls of the chamber body 102. Process gas is supplied from an array of process gas supplies such as gas supplies (e.g., gas source) 138 through an array of valves 140 which are coupled to the first valve 132 and second valve 136. Process gas species and gas flow rates delivered into the process volume 101 can be independently controllable. For example, gas flow through the upper gas injectors 130 may be different from gas flow through the lower gas injectors 134. The controller 126 governs the array of valves 140.

In embodiments, one or more inert gases, such as argon (Ar), helium (He) (or other inert gas), and/or one or more reactive gases, such as methane ($CH_4$), acetylene ($C_2H_2$), hydrogen ($H_2$), hydrogen bromide (HBr), ammonia ($NH_3$), disilane ($Si_2H$), nitrogen trifluoride ($NF_3$), tetrafluoromethane ($CF_4$), sulfur hexafluoride ($SF_6$), carbon monoxide (CO), carbonyl sulfide (COS), trifluoromethane ($CHF_3$), hexafluorobutadiene ($C_4F_6$), chlorine ($C_2$), nitrogen ($N_2$), oxygen ($O_2$), combinations thereof, and the like can be supplied into the process volume 101 through either or both the upper gas injectors 130 and the lower gas injectors 134. In some embodiments, the process gas delivered to the process volume 101 adjacent the electrode 108 can accelerate secondary electrons toward the substrate 111, as will be described in greater detail below, and/or buffer the electrode 108 from a reactive plasma formed in the process volume 101, thus increasing the useful life of the electrode 108.

In accordance with the present disclosure, plasma is generated in the process volume 101 by various bulk and surface processes, for example, by capacitive coupling 170 (e.g., capacitive coupling plasma (CCP)) and/or inductive coupling 172 (e.g., inductive coupling plasma (ICP)). Inductively coupled power or high frequency capacitively coupled power can be used to achieve independent control of plasma density, aside from bias power controlling ion energy. Accordingly, when the processing chamber 100 is configured for use with the capacitive coupling 170 (e.g., configured as a CCP reactor), source power can refer to a higher frequency (compared to bias) power being applied to either a bias electrode (e.g., the electrode 144), which supports the substrate 111, or the upper electrode, e.g., the electrode 108. Alternatively or additionally, when the processing chamber 100 is configured for use with the inductive coupling 172 (e.g., configured as an ICP reactor), the source power refers to power applied to a coil 173 (shown in phantom in FIG. 1). When the processing chamber 100 is configured as an ICP reactor, a dielectric window 175 (also shown in phantom) is provided on a side of the chamber body 102 of the processing chamber 100. The dielectric window 175 is configured to provide a vacuum boundary and a window for electromagnetic wave exciting plasma.

Ions generated by a CCP or ICP are influenced by an electric field that encourages ion bombardment of the electrode 108 by the ions generated from the plasma, as will be described in greater detail below. Moreover, depending on a mode of operation of the processing chamber 100, ion bombardment energy of the electrode 108 can be a function of a power supplied to the electrode 108, e.g., provided by one or more of the DC voltage power supply 154, the low frequency RF power source 122, or the high frequency RF power source 120. For example, in at least some embodiments, ion bombardment energy of the electrode 108 can be provided by application of voltage from one or both the DC voltage power supply 154 and the low frequency RF power source 122. In at least some embodiments, in addition to using one or both the DC voltage power supply 154 and the low frequency RF power source 122, the high frequency RF power source 120 can be used to increase plasma density and ebeam flux.

When the DC voltage power supply 154 is used to supply power (e.g., bias) to the electrode 108, the power supplied by the DC voltage power supply 154 can be about 1 W to about 30 kW (e.g., about −1560V to about −1440V). Similarly, when the low frequency RF power source 122 is used to supply power (e.g., bias) to the electrode 108, the power supplied by the low frequency RF power source 122 can be about 1 W to about 30 KW with a frequency from about 100 kHz and about 20 MHz. Likewise, when the high frequency RF power source 120 is used in conjunction with either or both the DC voltage power supply 154 and the low frequency RF power source 122, the power supplied by the high frequency RF power source 120 can be about 1 W to about 10 kW with a frequency from about 20 MHz and about 200 MHz.

In some embodiments, an RF bias power source 162 can be coupled through an impedance matching network 164 to an electrode 144 of the pedestal 110. The RF bias power source 162, if used, is configured to accelerate ions onto the substrate 111. The RF bias power source 162 can be configured to provide low frequency RF power and/or high frequency RF power. For example, in at least some embodiments, the RF bias power source 162 can be configured to supply 1 W to 30 kW of power to the electrode 144 at one or more frequencies, e.g., of about 100 kHz to about 200 MHz. In some embodiments, for example, the RF bias power source 162 can be configured to supply 1 W to 30 kW of power to the electrode 144 at a frequency of about 100 kHz to about 100 MHz.

A waveform tailoring processor 147 may be connected between an output of the impedance matching network 164 and the electrode 144 and/or an output of the impedance matching network 124 and the electrode 108. The waveform tailoring processor 147 controller can be configured to change a waveform produced by the RF bias power source 162 and/or the high frequency RF power source 120 and the low frequency RF power source 122 to a desired waveform. The ion energy of plasma near the substrate 111 and/or the electrode 108 can be controlled by the waveform tailoring processor 147. For example, in some embodiments, the waveform tailoring processor 247 produces a waveform in which an amplitude is held during a certain portion of each RF cycle at a level corresponding to a desired ion energy level. The controller 126 controls the waveform tailoring processor 147.

Etching of the substrate 111 can be also influenced by one or more factors. For example, pressure (in addition to ebeam energy, ebeam plasma power, and bias power if used) can influence etching of the substrate 111. Accordingly, in an embodiment, a pressure maintained in the process volume 101 during EBIE of the substrate 111 can be between about 0.1 mTorr to about 300 mTorr. For example, in at least some embodiments, such as when ebeam neutralization and etch profile control are necessary, a pressure maintained in the process volume 101 during EBIE of the substrate 111 can be between about 0.1 mTorr to about 30 mTorr. Likewise, in at least some embodiments, such as when ebeam neutralization and etch profile control are not necessary and bias power is not needed, a pressure maintained in the process volume 101 during EBIE of the substrate 111 can be between about 0.1 mTorr to about 100 mTorr. The pressure is generated by a vacuum pump 168 which is in fluid communication with the process volume 101. The pressure is regulated by a gate valve 166 which is disposed between the process volume 101 and the vacuum pump 168. The controller 126 controls the vacuum pump 168 and/or the gate valve 166.

Figure 2:
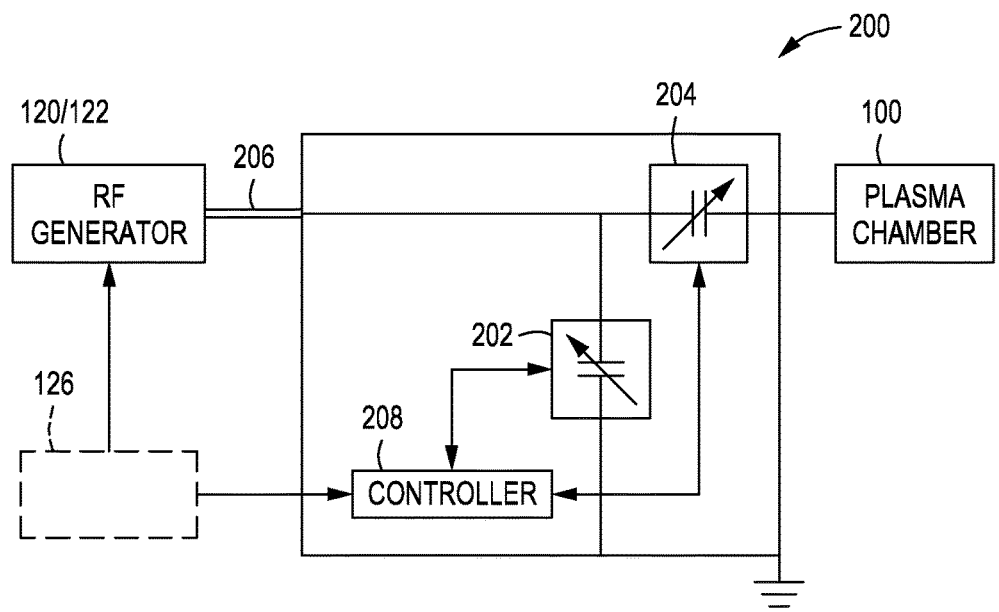
FIG. 2 is a block diagram of a sensorless impedance matching network configured for use with the apparatus of FIG. 1, in accordance with one or more embodiments of the present disclosure.

FIG. 2 is a block diagram of a sensorless impedance matching network 200 (e.g., the impedance matching network 124 or the impedance matching network 164) configured for use with the apparatus of FIG. 1, in accordance with one or more embodiments of the present disclosure. The sensorless impedance matching network 200 can comprise one or more capacitors and inductors. For example, in at least some embodiments, the sensorless impedance matching network 200 can comprise a shunt variable capacitor 202 and a series variable capacitor 204. The sensorless impedance matching network 200 can be a component of or connected to an RF power source (e.g., the high frequency RF power source 120 and the low frequency RF power source 122) through a 50Ω transmission line 206. In at least some embodiments, the sensorless impedance matching network 200 can be a component of or connected to the RF bias power source 162, the $V_{rf}$ connected to the capacitive coupling 170, and/or the r connected to inductive coupling 172, also through a 50Ω transmission line. In at least some embodiments, the sensorless impedance matching network 200 can also comprise an L-type sensorless impedance matching network. For example, in at least some embodiments, one or more fixed inductors can be connected in series with the shunt variable capacitor 202 and the series variable capacitor 204 for tuning range optimization.

Unlike conventional matching networks previously described, the sensodess impedance matching network does not use any sensors on the input side or the output and, thus, no sensor calibration data is required to be stored in a memory of a controller. In operation, the sensorless impedance matching network 200 receives forward power signals and reflected power signals directly from the RF generator. For example, the forward power signals and reflected power signals received from the RF source can be transmitted (e.g., via wired or wireless communication) to a match controller 208 of the sensodess impedance matching network 200. Alternatively or additionally, the match controller 208 can receive the forward power signals and reflected power signals from the controller 126. The match controller 208 uses the forward power signals and reflected power signals to tune the shunt variable capacitor 202 and the series variable capacitor 204. For example, in at least some embodiments, the match controller 208 uses a pre-programmed learning-based algorithm—which can be stored in a memory (e.g., the memory 131)—that comprises one or more parameters, such as, voltage standing wave ratio (VSWR), reflection coefficient, etc., to calculate capacitance values for the shunt variable capacitor 202 and the series variable capacitor 204.

Figure 3:
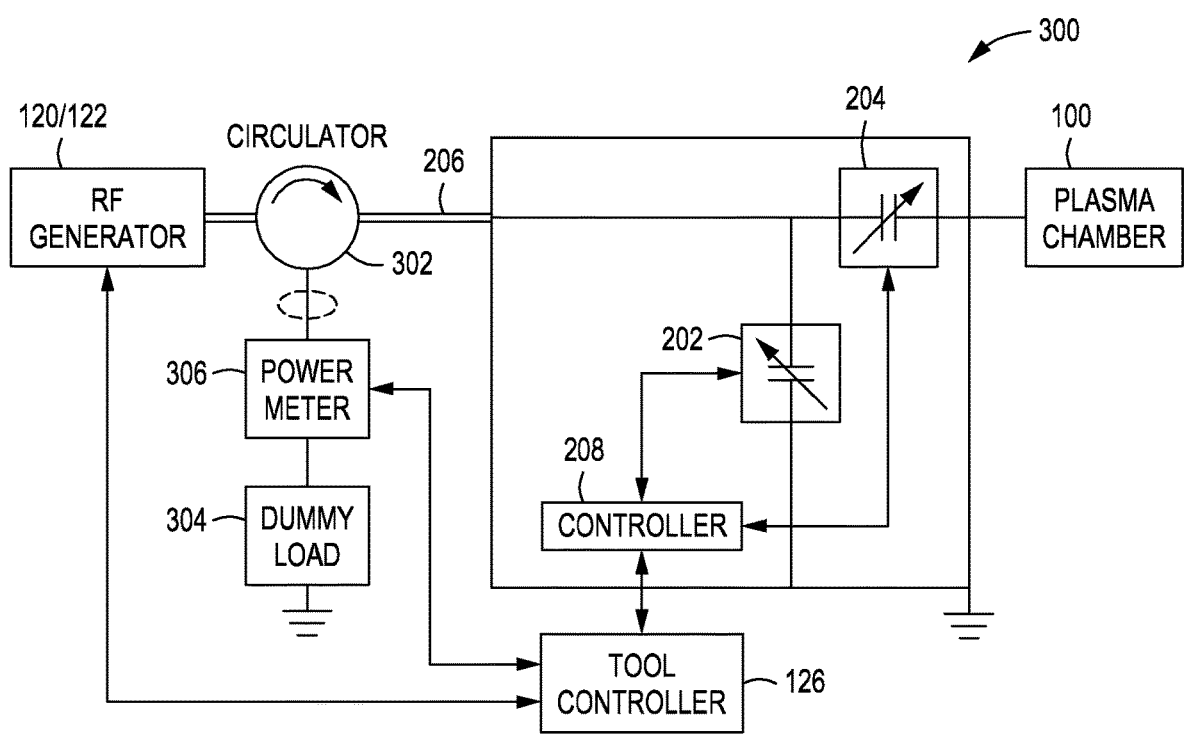
FIG. 3 is a block diagram of a sensorless impedance matching network configured for use with the apparatus of FIG. 1, in accordance with one or more embodiments of the present disclosure.

FIG. 3 is a block diagram of a sensorless impedance matching network 300 (e.g., the impedance matching network 124 or the impedance matching network 164) configured for use with the apparatus of FIG. 1, in accordance with one or more embodiments of the present disclosure. The sensorless impedance matching network 300 is substantially identical to the sensorless impedance matching network 200.

Accordingly, only the features that are unique to the sensorless impedance matching network 300 are described herein.

The sensorless impedance matching network 300 comprises an RF circulator 302 comprising one or more terminals. For example, in at least some embodiments, the RF circulator 302 can comprise 3 terminals and is connected between the RF power source and the sensorless impedance matching network 300, via the 50Ω transmission line 206. The RF circulator 302 is configured to allow RF power to flow in one direction. For example, the forward power signals and reflected power signals pass through the RF circulator 302 and terminates in a 50Ω dummy load 304. In at least some embodiments, a power meter 306 can be used to measure the RF reflected power at a desired frequency. The reflected power signal can be transmitted to a tool controller (e.g., the controller 126) that is communicatively connected to the match controller 208. In at least some embodiments, the RF power source and the sensorless impedance matching network 300 can be synchronized and controlled by the tool controller. Alternatively, as noted above, the controller 126 need not be used and the power meter 306 and the dummy load 304 can be connected directly to the match controller 208.

Power meter data, RF power, and capacitor positions of the shunt variable capacitor 202 and the series variable capacitor 204 can be transmitted to the tool controller, and combined with one or more other system processing data, such as temperature, chemistry, and flow rate, thus creating cooperative intelligent real time control during operation. In at least some embodiments, the combined data can be used to teach a learning-based model.

Figure 4:
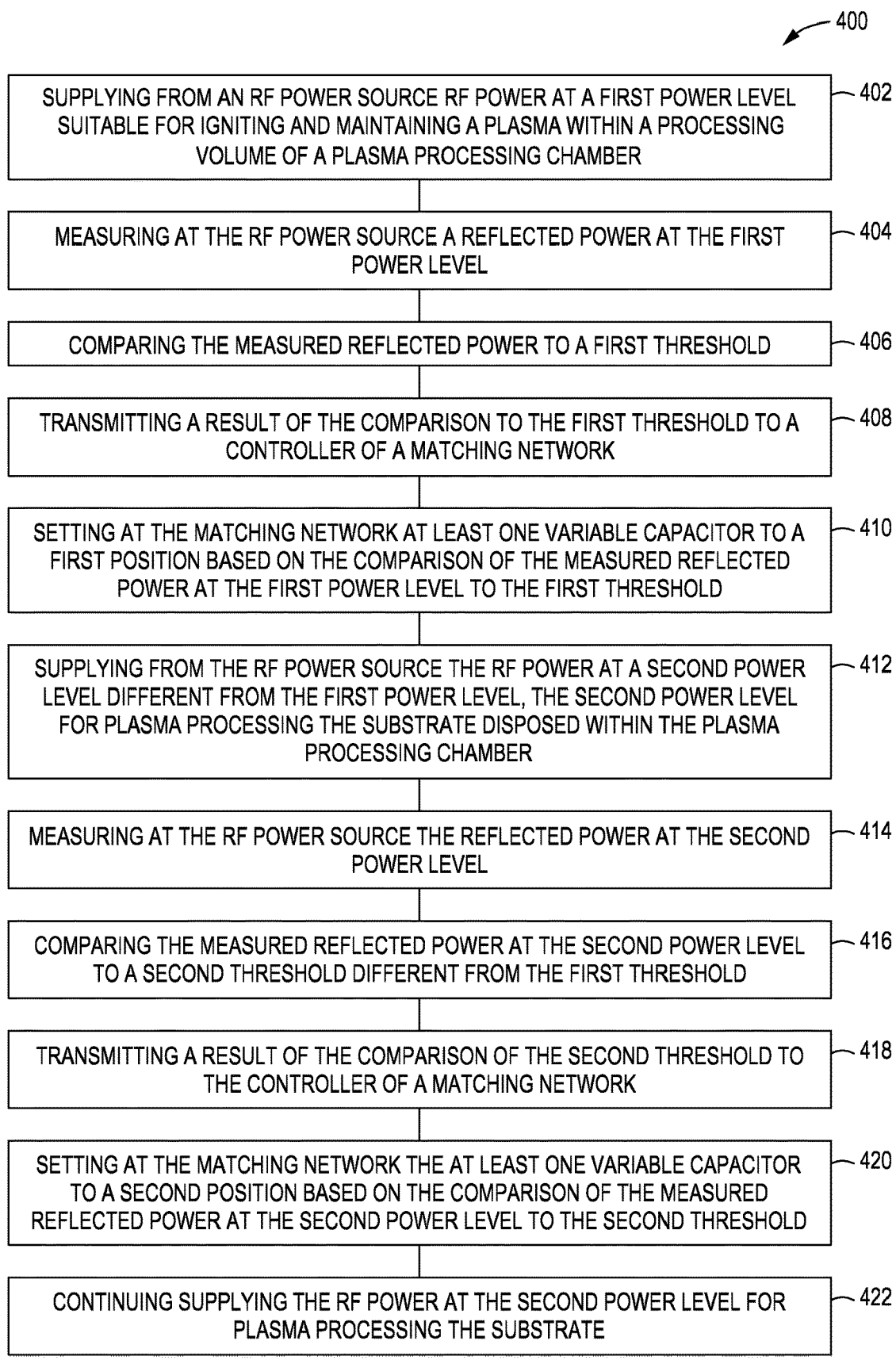
FIG. 4 is a flowchart of a method for processing a substrate, in accordance with one or more embodiments of the present disclosure.

FIG. 4 is a flowchart of a method 400 for processing a substrate, in accordance with one or more embodiments of the present disclosure. The method 400 can be performed using, for example, a processing chamber that is configured for performing EBIE of a substrate, e.g., the processing chamber 100. For illustrative purposes, the processing chamber is assumed configured as a CCP reactor configured for EBIE of a substrate, e.g., the substrate 111, which can be, for example, a 150 mm, 200 mm, 300 mm, 450 mm substrate, etc. For example, in at least some embodiments, the substrate can be a 300 mm substrate, such as a semiconductor wafer or the like. As can be appreciated, the herein described power/voltages and/or pulsing/duty cycles can be scaled accordingly, e.g., for substrates having diameters greater or less than 300 mm. Initially, one or more of the above described process gases can be introduced into a process volume, e.g., the process volume 101, of the process chamber. For example, in at least some embodiments, the process gas can be one or more of He, Ar, and the like (or other inert gas), and/or $H_2$, HBr, $NH_3$, $Si_2H_6$, $CH_4$, $C_2H_2$, $NF_3$, $CF_4$, $SF_6$, CO, COS, $CHF_3$, $C_4Fe$, $Cl_2$, $N_2$, $O_2$, and the like (or other reactive gas). Additionally, the process volume can be maintained at one or more operating pressures from about 0.1 mTorr to about 300 mTorr.

In at least some embodiments, the method 400 comprises two main steps, a first pre-learning phase, which uses a relatively low power to ignite and maintain a plasma, and a second tuning phase, which uses a relatively high power to plasma process a substrate.

During the first pre-learning phase, at 402, the method 400 comprises supplying from an RF power source configured to supply RF power at a first power level suitable for igniting and maintaining a plasma within a processing volume of a plasma processing chamber. For example, in at least some embodiments, the RF power source can provide RF power (e.g., 1 W to about 30 kW at a frequency of about 20 kHz to about 20 MHz) to the processing chamber 100 to ignite and maintain a plasma within the processing volume 101 of the processing chamber 100. For example, in at least some embodiments, the first power level can be about 1 W to about 30 kW and can be supplied at frequency of about 100 kHz to about 20 MHz.

Based on a reflected power signal measured from the RF generator, a controller (e.g., the controller 126) determines positions of one or more series variable capacitors and one or more shunt variable capacitors. For example, at 404, the method 400 comprises measuring at the RF power source a reflected power at the first power level. For example, a controller (e.g., the controller 126) of the RF power source can measure the reflected power at the high frequency RF power source 120 (and/or the low frequency RF power source 122).

Next, at 406, the method 400 comprises comparing the measured reflected power to a first threshold. For example, in at least some embodiments, the first threshold can be about 10% of the reflected power at the first power level. Additionally, comparing the measured reflected power to a first threshold can comprise performing frequency tuning, e.g., at the RF power generator.

Next, at 408, the method 400 comprises transmitting a result of the comparison to the first threshold to a controller of a matching network. For example, the controller of the RF power source transmits the result of the comparison to the first threshold to the match controller 208 of the sensorless impedance matching network 200. Next, at 410, the method 400 comprises setting at the matching network at least one variable capacitor to a first position based on the comparison of the measured reflected power at the first power level to the first threshold. For example, the match controller 208 of the sensorless impedance matching network 200 can set one or both of the shunt variable capacitor 202 and the series variable capacitor 204 to one or more positions, which can be stored in a memory of the match controller 208. In at least some embodiments, the match controller 208 can use one or more optimization algorithms (e.g., gradient based methods, derivative-free methods, and/or model-based methods) to determine the one or more positions that the shunt variable capacitor 202 and the series variable capacitor 204 can be set to.

During the second tuning phase (e.g., fine-tuning phase), an algorithm can be implemented using a relatively small threshold value. For example, at 412, the method 400 comprises supplying from the RF power source the RF power at a second power level, different from the first power level. The second power level used during the second tuning phase is used for plasma processing the substrate disposed within the plasma processing chamber. For example, in at least some embodiments, the RF power source can provide RF power (e.g., 1 W to about 10 kW at a frequency of about 20 MHz to about 200 MHz) to the processing chamber 100 for plasma processing the substrate. In at least some embodiments, the RF power can be supplied in a pulsed mode, including a single level pulse mode or a multilevel pulse mode. Additionally, in at least some embodiments, frequency tuning techniques at the RF plasma source can also be used during the second tuning phase.

Next, at 414, the method 400 comprises measuring at the RF power source the reflected power at the second power level. For example, as noted above, a controller (e.g., the controller 126) of the RF power source can measure the reflected power at the high frequency RF power source 120 (and/or the low frequency RF power source 122).

Next, at 416, the method 400 comprises comparing the measured reflected power at the second power level to a second threshold different from the first threshold (e.g., the second threshold is less than the first power level). For example, in at least some embodiments, the second threshold can be about 1% to about 9% of the reflected power at the first power level. Additionally, similar to 406 comparing the measured reflected power to a second threshold can comprise performing frequency tuning, e.g., at the RF power generator.

Next, at 418, the method 400 comprises transmitting a result of the comparison of the second threshold to the controller of a matching network. For example, the controller of the RF power source transmits the result of the comparison to the second threshold to the match controller 208 of the sensorless impedance matching network 200. Next, at 420, the method 400 comprises setting at the matching network at least one variable capacitor to a second position based on the comparison of the measured reflected power at the second power level to the second threshold. For example, the match controller 208 of the sensorless impedance matching network 200 can set one or both of the shunt variable capacitor 202 and the series variable capacitor 204 to one or more positions, which can be stored in a memory of the match controller 208. In at least some embodiments, the match controller 208 can use one or more optimization algorithms (e.g., gradient based methods, derivative-free methods, and/or model-based methods) to determine the one or more positions that the shunt variable capacitor 202 and the series variable capacitor 204 can be set to. Next, at 422, the method 400 comprises continuing supplying the RF power at the second power level for plasma processing the substrate.

Operation of the method 400 using the sensorless impedance matching network 300 is substantially identical to operation of the method 400 using the sensorless impedance matching network 200. For example, instead of using reflected power at the RF power source as described above, the controller 126 can be configured to receive measurements from the power meter 306 that is connected to the RF circulator 302 when performing the method 400.

Additionally, the method 400 can be used in conjunction with an RF bias power source during operation. For example, the method 400 can be used with the RF bias power source 162.

All data, including motor position, forward powers/reflected powers, pressure, chemistry, etc. can be stored in memory (e.g., the memory 131 or a local memory of the sensorless impedance matching network 200 and the sensorless impedance matching network 300 (not shown in FIGS. 2 and 3)), and can be accessed by the controller 126 or the match controller 208 in the method 400. Such data can be used for the learning-based tuning algorithm (which can be based on history results, empirical data, etc.) and tuning trajectory optimization. In some embodiments, the sensorless impedance matching network 200 and the sensorless impedance matching network 300 can tune to new positions based on results from all history runs.

While the foregoing is directed to embodiments of the present disclosure, other and further embodiments of the disclosure may be devised without departing from the basic scope thereof.

The invention claimed is:

1. A method for plasma processing a substrate, comprising:

supplying from an RF power source RF power at a first power level suitable for igniting and maintaining a plasma within a processing volume of a plasma processing chamber;

measuring at the RF power source a reflected power at the first power level;

comparing the measured reflected power to a first threshold;

transmitting a result of a comparison to the first threshold to a controller of a matching network;

setting at the matching network at least one variable capacitor to a first position based on the comparison of the measured reflected power at the first power level to the first threshold;

supplying from the RF power source the RF power at a second power level different from the first power level, the second power level for plasma processing the substrate disposed within the plasma processing chamber;

measuring at the RF power source the reflected power at the second power level;

comparing the measured reflected power at the second power level to a second threshold different from the first threshold;

transmitting a result of a comparison of the second threshold to the controller of the matching network;

setting at the matching network the at least one variable capacitor to a second position based on the comparison of the measured reflected power at the second power level to the second threshold; and continuing supplying the RF power at the second power level for plasma processing the substrate.

2. The method of claim 1, wherein setting the at least one variable capacitor to the first position and the second position comprises using at least one of gradient based methods, derivative-free methods, model-based methods, or learning-based tuning algorithm.

3. The method of claim 1, wherein the first threshold is about 10% of the reflected power at the first power level.

4. The method of claim 3, wherein the second threshold is less than the first power level.

5. The method of claim 1, wherein supplying the RF power at the second power level comprises supplying the RF power in a pulsed mode.

6. The method of claim 5, wherein the pulsed mode is a single level pulse mode.

7. The method of claim 5, wherein the pulsed mode is a multilevel pulse mode.

8. The method of claim 1, wherein at least one of the comparing the measured reflected power to the first threshold or the comparing the measured reflected power to the second threshold further comprises performing frequency tuning.

9. The method of claim 1, wherein setting the at least one variable capacitor to the first position and the second position comprises setting at least one of series variable capacitors or shunt variable capacitors.

10. A non-transitory computer readable storage medium having stored thereon instructions that when executed by a processor perform a method for plasma processing a substrate, comprising:

supplying from an RF power source RF power at a first power level suitable for igniting and maintaining a plasma within a processing volume of a plasma processing chamber;

measuring at the RF power source a reflected power at the first power level;

comparing the measured reflected power to a first threshold;

transmitting a result of a comparison to the first threshold to a controller of a matching network;

setting at the matching network at least one variable capacitor to a first position based on the comparison of the measured reflected power at the first power level to the first threshold;

supplying from the RF power source the RF power at a second power level different from the first power level, the second power level for plasma processing the substrate disposed within the plasma processing chamber;

measuring at the RF power source the reflected power at the second power level;

comparing the measured reflected power at the second power level to a second threshold different from the first threshold;

transmitting a result of a comparison of the second threshold to the controller of the matching network;

setting at the matching network the at least one variable capacitor to a second position based on the comparison of the measured reflected power at the second power level to the second threshold; and continuing supplying the RF power at the second power level for plasma processing the substrate.

11. The non-transitory computer readable storage medium of claim 10, wherein setting the at least one variable capacitor to the first position and the second position comprises using at least one of gradient based methods, derivative-free methods, model-based methods, or learning-based tuning algorithm.

12. The non-transitory computer readable storage medium of claim 10, wherein the first threshold is about 10% of the reflected power at the first power level.

13. The non-transitory computer readable storage medium of claim 12, wherein the second threshold is less than the first power level.

14. The non-transitory computer readable storage medium of claim 10, wherein supplying the RF power at the second power level comprises supplying the RF power in a pulsed mode.

15. The non-transitory computer readable storage medium of claim 14, wherein the pulsed mode is a single level pulse mode.

16. The non-transitory computer readable storage medium of claim 14, wherein the pulsed mode is a multilevel pulse mode.

17. The non-transitory computer readable storage medium of claim 10, wherein at least one of the comparing the measured reflected power to the first threshold or the comparing the measured reflected power to the second threshold further comprises performing frequency tuning.

18. The non-transitory computer readable storage medium of claim 10, wherein setting the at least one variable capacitor to the first position and the second position comprises setting at least one of series variable capacitors or shunt variable capacitors.

19. A system for processing a substrate, comprising:

an RF power source configured to supply RF power;

a gas source configured to supply a process gas into a processing volume of a plasma processing chamber;

a matching network configured to set at least one variable capacitor based on a result of a comparison received from the RF power source; and a controller configured to:
  supply from the RF power source RF power at a first power level suitable for igniting and maintaining a plasma within the processing volume of the plasma processing chamber;
  measure at the RF power source a reflected power at the first power level;
  compare the measured reflected power to a first threshold;
  transmit the result of the comparison to the first threshold to a match controller of the matching network;
  set at the matching network at least one variable capacitor to a first position based on the comparison of the measured reflected power at the first power level to the first threshold;
  supply from the RF power source the RF power at a second power level different from the first power level, the second power level for plasma processing the substrate disposed within the plasma processing chamber;
  measure at the RF power source the reflected power at the second power level;
  compare the measured reflected power at the second power level to a second threshold different from the first threshold;
  transmit a result of the comparison of the second threshold to the match controller of the matching network;
  set at the matching network the at least one variable capacitor to a second position based on the comparison of the measured reflected power at the second power level to the second threshold; and
  continue supplying the RF power at the second power level for plasma processing the substrate.

20. The system of claim 19, further comprising:

a circulator connected between the RF power source and the matching network;

a power meter connected to the circulator and the controller; and a dummy load connected to the circulator.

* * * * *